(12) United States Patent
Lee

(10) Patent No.: US 6,900,485 B2
(45) Date of Patent: May 31, 2005

(54) UNIT PIXEL IN CMOS IMAGE SENSOR WITH ENHANCED RESET EFFICIENCY

(75) Inventor: Won-Ho Lee, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 10/746,042

(22) Filed: Dec. 23, 2003

(65) Prior Publication Data

US 2004/0217426 A1 Nov. 4, 2004

(30) Foreign Application Priority Data

Apr. 30, 2003 (KR) ................................. 10-2003-0027884

(51) Int. Cl.$^7$ ...................... H01L 31/062; H01L 31/113
(52) U.S. Cl. ........................ 257/292; 257/290; 257/291
(58) Field of Search ................................ 257/290–292

(56) References Cited

U.S. PATENT DOCUMENTS

| | | | | |
|---|---|---|---|---|
| 6,040,593 A | * | 3/2000 | Park ............................ | 257/292 |
| 6,215,113 B1 | * | 4/2001 | Chen et al. ............... | 250/208.1 |
| 6,512,280 B2 | * | 1/2003 | Chen et al. .................. | 257/465 |
| 6,822,306 B2 | * | 11/2004 | Mabuchi ..................... | 257/443 |
| 6,838,742 B2 | * | 1/2005 | Rhodes ........................ | 257/448 |
| 2001/0002045 A1 | * | 5/2001 | Fossum et al. ................ | 257/1 |
| 2001/0012133 A1 | * | 8/2001 | Yoneda et al. .............. | 358/482 |
| 2004/0217426 A1 | * | 11/2004 | Lee ............................ | 257/369 |

* cited by examiner

Primary Examiner—George Eckert
Assistant Examiner—Jesse A. Fenty
(74) Attorney, Agent, or Firm—Blakely Sokoloff Taylor & Zafman

(57) ABSTRACT

A unit pixel in a CMOS image sensor is employed to reduce a threshold voltage of a reset transistor by modifying a unit pixel circuit. The unit pixel in the CMOS image sensor including: a semiconductor substrate including an epitaxial layer in which an active area and a FOX area are defined; a photodiode formed in the epitaxial layer; a transfer transistor including source/drain regions disposed between the photodiode and a floating diffusion node, wherein a control signal is applied to a gate thereof; a reset transistor including source/drain regions disposed between the floating diffusion node and a VDD terminal, wherein a control signal is applied to a drain thereof; a drive transistor of which a gate is connected to the floating diffusion node and a drain is connected to the VDD terminal; and a selection transistor of which a drain is connected to the drain of the drive transistor and a source is connected to an output terminal, wherein a control signal is applied to a gate thereof.

18 Claims, 6 Drawing Sheets

UNIT PIXEL IN CMOS IMAGE SENSOR WITH ENHANCED RESET EFFICIENCY

FIELD OF THE INVENTION

The present invention relates to a semiconductor device; and, more particularly, to a unit pixel in a complementary metal oxide semiconductor (CMOS) image sensor with an enhanced reset efficiency by modifying a unit pixel circuit.

DESCRIPTION OF THE PRIOR ART

A complementary metal oxide semiconductor (CMOS) image sensor is a device that converts an optical image to an electrical signal using a CMOS manufacturing technology, which employs a switching scheme of an MOS transistor for transporting photo-electric charges from a photodiode to an output node as well as detection of an output signal at the output node. In contrast with a charge coupled device (CCD) image sensor, the CMOS image sensor has following merits; its driving scheme is simplified and various scanning schemes may be implemented; it allows a signal processing circuit to be integrated on a single chip thereby minimize products; and it secures lower production costs and low power consumptions.

Referring to FIG. 1, there is shown a circuit diagram of a conventional unit pixel in a CMOS image sensor. In FIG. 1, the conventional unit pixel in the CMOS image sensor includes one photodiode 11 and four NMOS transistors 12, 14, 15 and 16. The four transistors include a transfer transistor 12 for transferring the photo-electric charges generated from the photodiode 11 to a floating diffusion region 13, a reset transistor 14 for discharging the charges stored in the floating diffusion region 13 to detect subsequent signals, a drive transistor 15 acting as a source follower, and a selection transistor 16 for switching and addressing. In FIG. 1, a denotation of $C_F$, $C_P$, Vout and Load Tr represent a capacitance of the floating diffusion region 13, a capacitance of the photodiode 11, an output voltage of the unit pixel and a load transistor, respectively.

In the conventional unit pixel circuit, a power supply voltage (VDD) is applied to a drain of the reset transistor 14 and a gate voltage is applied to a gate of the reset transistor 14. When the gate voltage is applied to the gate of the reset transistor 14, it is required to form an inversion channel between the source and the drain in order for a current to flow therethrough. That is, a specific voltage is provided for the inversion channel in a semiconductor substrate, which is called a threshold voltage. Therefore, in the conventional unit pixel circuit, if a sufficiently high voltage, which exceeds the threshold voltage, is applied to the gate electrode of the reset transistor 14, an inversion current channel is produced at the semiconductor substrate between the drain and the source of the reset transistor 14, and a current can flow through the inversion current channel. Accordingly, there is generated a lag phenomenon till the gate voltage exceeds the specific threshold voltage, which is shown in FIG. 2.

Referring to FIG. 2, there is shown a graph setting forth an output voltage (Rx Vout) of the reset transistor 14 versus a gate voltage (Vg) applied to a gate of the reset transistor 14 according to the conventional unit pixel circuit of the CMOS image sensor.

In FIG. 2, the output voltage (Rx Vout) of the reset transistor 14 increases as the gate voltage (Vg) increases. However, when the gate voltage (Vg) reaches a predetermined value, the output voltage (Rx Vout) does not increase so that the output voltage (Rx Vout) becomes saturated because of a body effect. Meanwhile, the reset transistor 14 has a threshold voltage when the gate voltage is applied to the gate thereof, whereby the lag phenomenon is inevitably happened in the conventional unit pixel circuit in the CMOS image sensor as illustrated above. In order to maximize a reset efficiency of the reset transistor 14, however, the threshold voltage of the reset transistor 14 should be reduced. In an attempt to reduce the threshold voltage, a native nMOSFET (n-type metal oxide semiconductor field effect transistor) is typically employed in the conventional CMOS image sensor.

As shown in FIG. 2, as the threshold voltage (Vth) of the reset transistor 14 is reduced to a predetermined value (Vth'), the output voltage (Rx Vout) increases at a fixed gate voltage because the voltage curve is shifted to a left direction parallel with a horizontal axis. Herein, an increase amount of the output voltage (Rx Vout) is denoted as ΔVout at the fixed gate voltage (Vg1). Therefore, it is possible to reduce the lag phenomenon by means of the reduction of the threshold voltage of the reset transistor 14.

Referring to FIG. 3, there is shown another graph showing an output voltage (Rx Vout) versus a drain voltage (Vd) of the reset transistor 14 when the gate voltage (Vg) is variously applied to the gate of the reset transistor 14.

In FIG. 3, when the drain voltage (Vd) is fixed to a predetermined value, the output voltage (Rx Vout) of the reset transistor 14 increases more and more as the gate voltage (Vg) is higher and higher. The difference between the output voltage curves is determined by the increase amount (Δvg) of the gate voltage (Vg). Therefore, as the threshold voltage is increased more and more, the higher gate voltage is required for operation of the reset transistor 14. Concurrently, the output voltage (Rx Vout) becomes lower at the fixed drain voltage, thereby degrading the reset efficiency in the long run.

In the conventional CMOS image sensor, as described above, since the VDD is applied to the drain of the reset transistor 14 and the gate voltage is applied to the gate thereof, it is difficult to reduce the threshold voltage of the reset transistor 14. Therefore, the lag phenomenon is unavoidably generated, thereby degrading an output performance of the reset transistor 14 and the reset efficiency. Thus, it is required to reduce the threshold voltage of the reset transistor 14 in order to increase the reset efficiency in the CMOS image sensor.

SUMMARY OF THE INVENTION

It is, therefore, an object of the present invention to provide a unit pixel in a complementary metal oxide semiconductor (CMOS) image sensor in order to reduce a threshold voltage of a reset transistor by applying a VDD to a gate of the reset transistor and applying a reset control signal to a drain of the reset transistor.

In accordance with one aspect of the present invention, there is provided A unit pixel for use in a complementary metal oxide semiconductor (CMOS) image sensor, comprising: a semiconductor substrate including an epitaxial layer in which an active area and a field oxide (FOX) area are defined; a photodiode formed in a predetermined location of the epitaxial layer; a transfer transistor including source/drain regions disposed between the photodiode and a floating diffusion region, wherein a transfer control signal is applied to a gate thereof; a reset transistor including source/drain regions disposed between the floating diffusion region and a power supply voltage (VDD) terminal, wherein a reset control signal is applied to a drain thereof; a drive transistor of which a gate is connected to the floating diffusion region and a drain is connected to the VDD terminal; and a selection transistor of which a drain is connected to a source of the drive transistor and a source is connected to an output terminal, wherein a select control signal is applied to a gate thereof.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
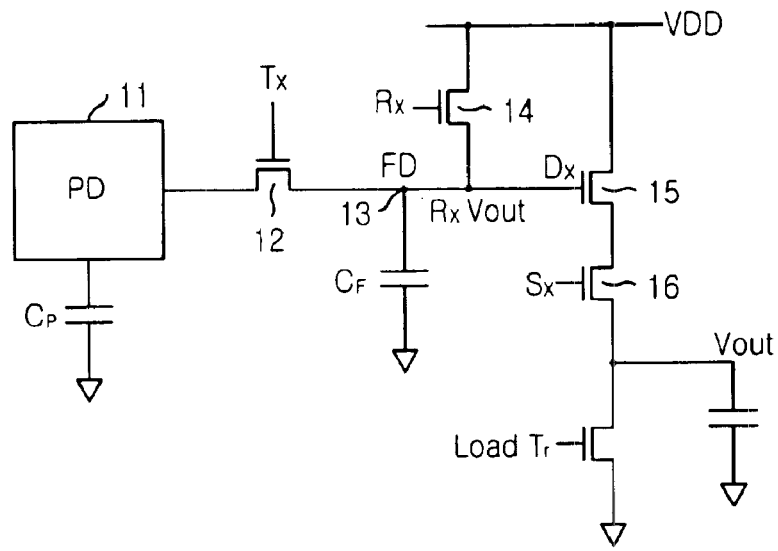
FIG. 1 is a circuit diagram setting forth a conventional unit pixel in a complementary metal oxide semiconductor (CMOS) image sensor.
Figure 2:
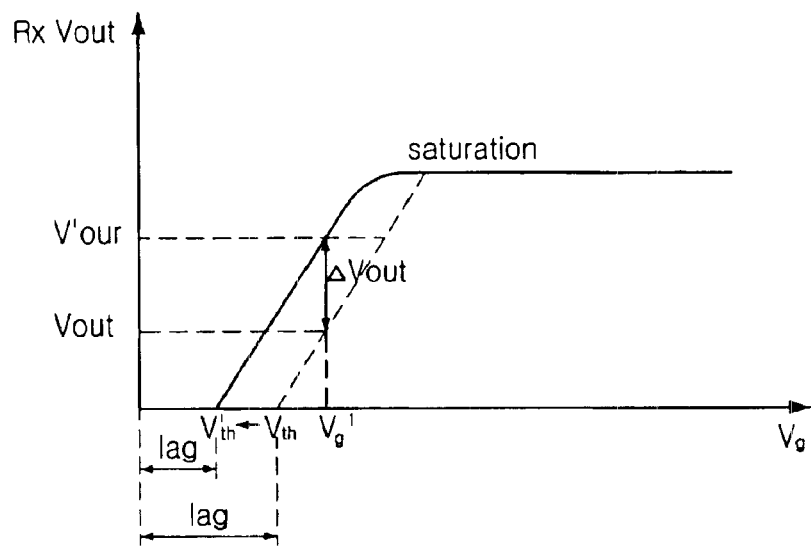
FIG. 2 is a graph showing an output voltage of a reset transistor versus a gate voltage setting forth a lag phenomenon in the conventional unit pixel of the CMOS image sensor.
Figure 3:
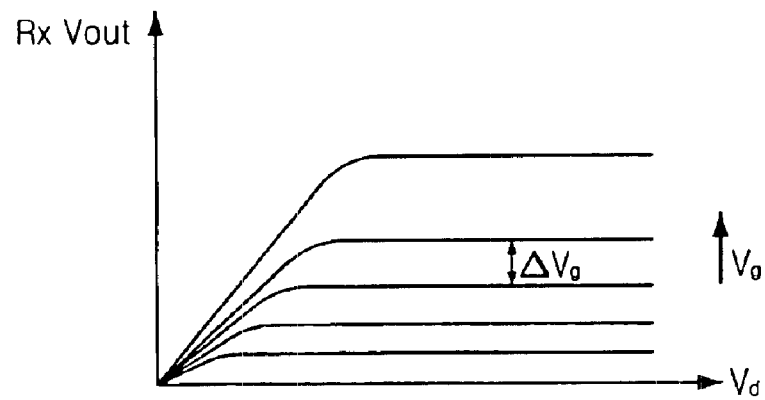
FIG. 3 is another graph showing an output voltage versus a drain voltage of a reset transistor by varying a value of the gate voltage in the conventional unit pixel of the CMOS image sensor.
Figure 4A:
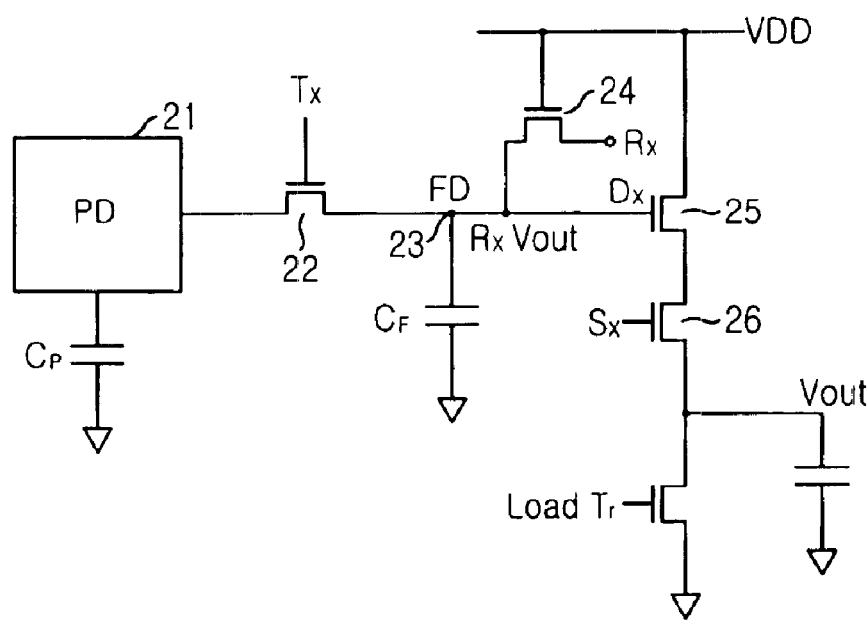
FIG. 4A is a circuit diagram setting forth a unit pixel in a CMOS image sensor in accordance with a first preferred embodiment of the present invention.
Figure 4B:
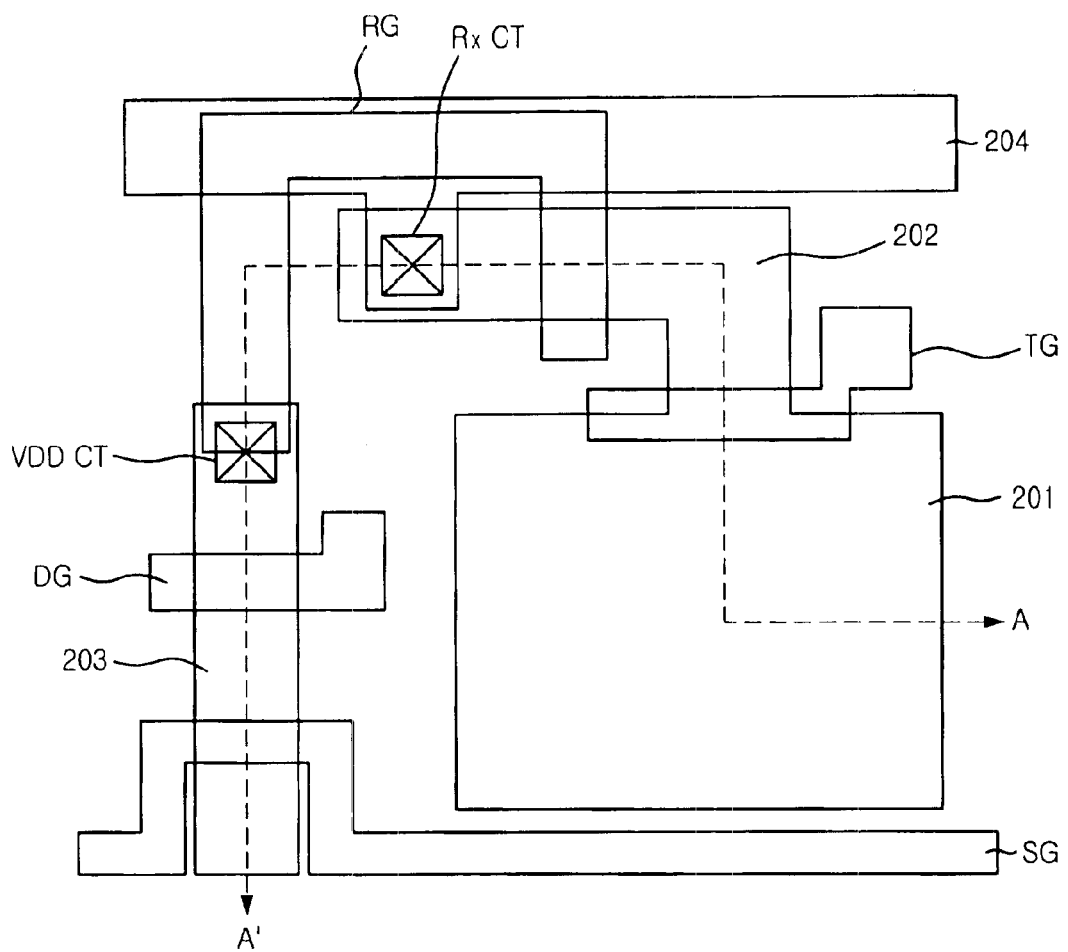
FIG. 4B is a plane view setting forth the unit pixel in the CMOS image sensor in accordance with the first preferred embodiment of the present invention.
Figure 4C:
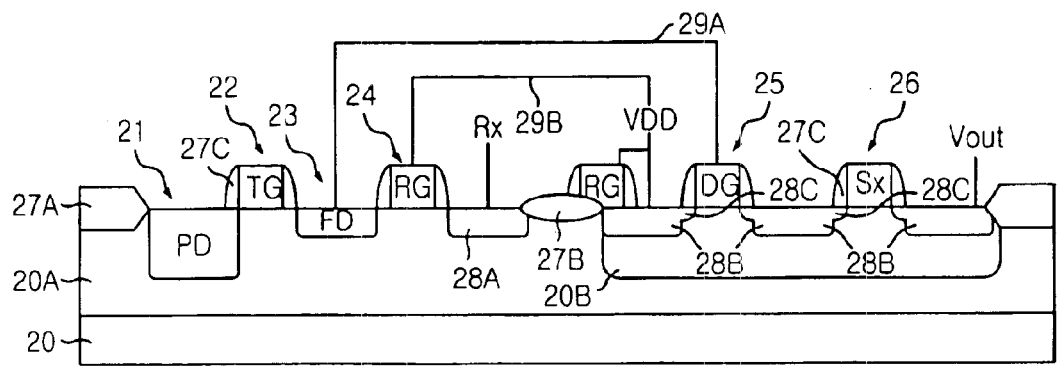
FIG. 4C is a cross sectional view setting forth the unit pixel in the CMOS image sensor in accordance with the first preferred embodiment of the present invention taken along line A–A' of FIG. 4B.
Figure 4D:
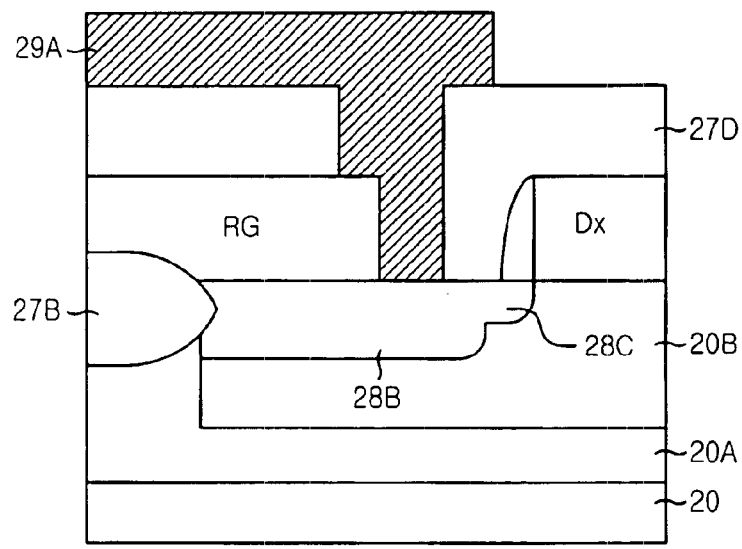
FIG. 4D is a cross sectional view setting forth a VDD contact in accordance with the first preferred embodiment of the present invention.
Figure 5A:
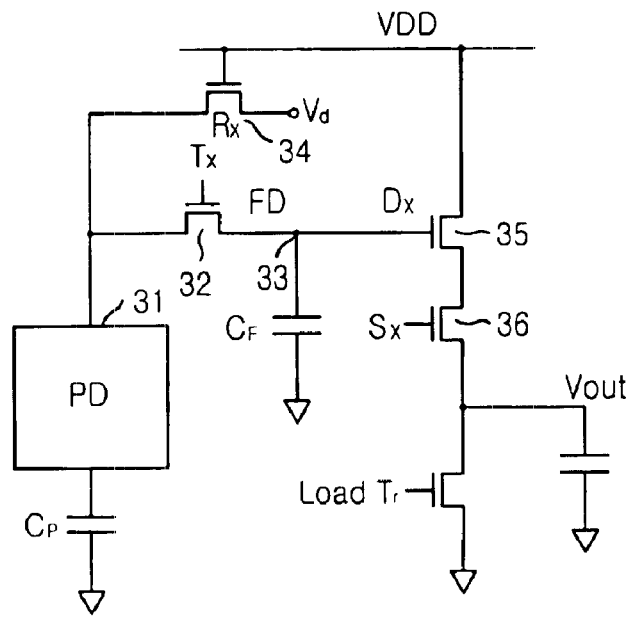
FIG. 5A is a circuit diagram setting forth a unit pixel in a CMOS image sensor in accordance with a second preferred embodiment of the present invention.
Figure 5B:
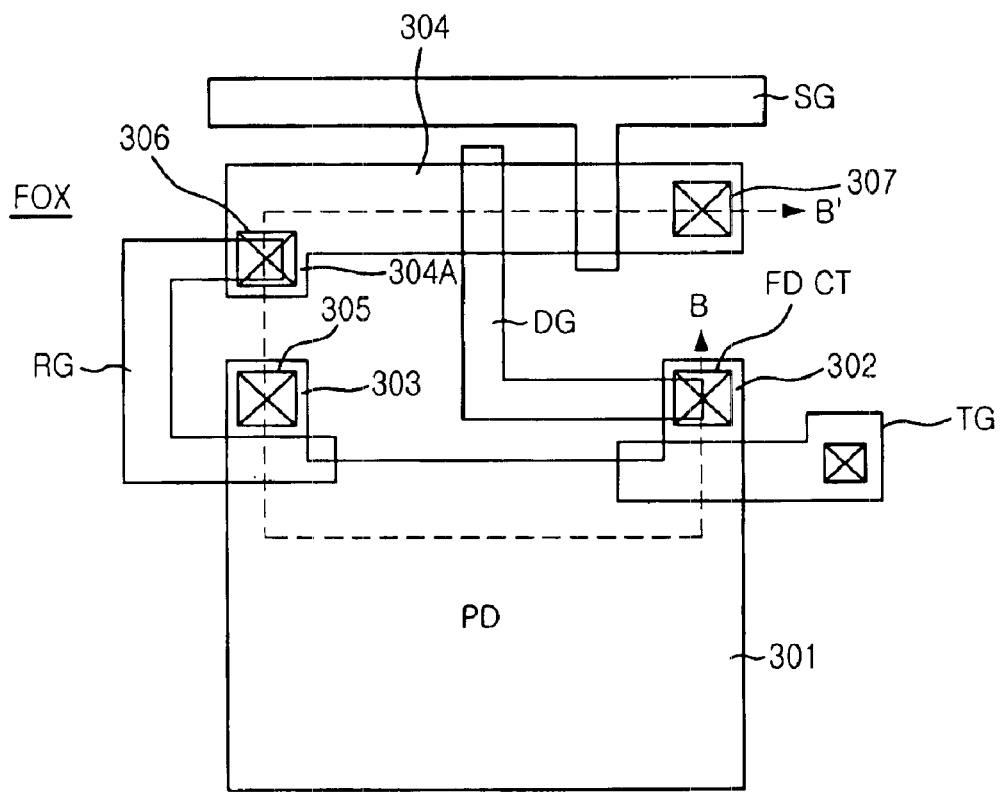
FIG. 5B is a plane view setting forth the unit pixel in the CMOS image sensor in accordance with the second preferred embodiment of the present invention.
Figure 5C:
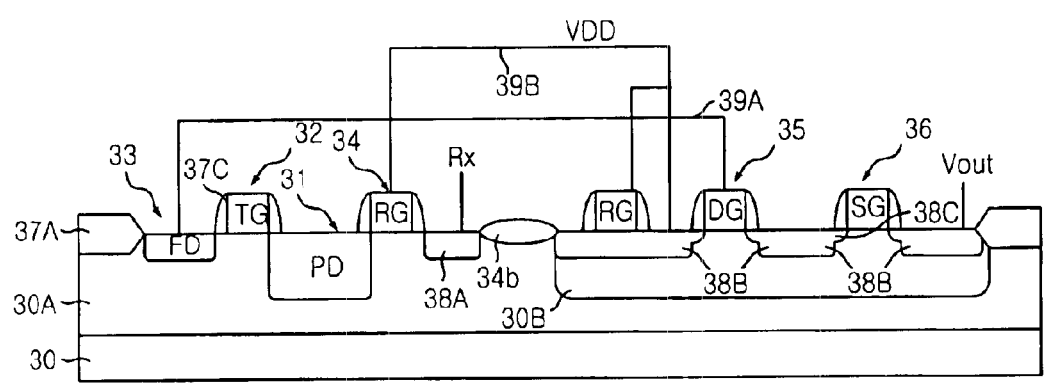
FIG. 5C is a cross sectional view setting forth the unit pixel in the CMOS image sensor in accordance with the second preferred embodiment of the present invention taken along line B–B' of FIG. 5B.

There are provided in FIGS. 4A to 4D and FIGS. 5A to 5C circuit diagrams, plane views and cross sectional views setting forth a unit pixel in a complementary metal oxide semiconductor (CMOS) image sensor in accordance with preferred embodiments of the present invention. It should be noted that like parts appearing in FIGS. 4A to 4D or in FIGS. 5A to 5C are represented by like reference numerals.

Referring to FIG. 4A, there is shown a circuit diagram setting forth a unit pixel in a CMOS image sensor in accordance with a first preferred embodiment of the present invention.

In FIG. 4A, the unit pixel includes a photodiode 21 and four NMOS transistors 22, 24, 25 and 26. The four transistors include a transfer transistor 22 for transferring photo-electric charges generated from the photodiode 21 to a floating diffusion region 23, a reset transistor 24 for discharging the charges stored in the floating diffusion region 23 to detect subsequent signals, a drive transistor 25 acting as a source follower, and a selection transistor 26 for switching and addressing.

In detail, the transfer transistor 22 having source/drain regions is disposed between the photodiode 21 and the floating diffusion region 23, wherein a transfer control signal (Tx) is applied to a gate of the transfer transistor 22. The reset transistor 24 having source/drain regions is disposed between the floating diffusion region 23 and a power supply voltage (VDD) terminal, wherein a reset control signal (Rx) is applied to a drain of the reset transistor 24 and a VDD is applied to a gate of the reset transistor 24. In the drive transistor 25, the VDD is applied to a drain and a drive control signal (Dx) is applied to a gate which is connected to the floating diffusion region 23. Meanwhile, the selection transistor 26 has source/drain regions of which a drain is connected to the source of the drive transistor 25 and a source of the selection transistor 26 is connected to an output terminal through an output contact, wherein a select control signal (Sx) is applied to a gate of the selection transistor 26. In FIG. 4A, a denotation of $C_F$, $C_P$, and Load Tr represent a capacitance of the floating diffusion region, a capacitance of the photodiode and a load transistor, respectively.

Referring to FIG. 4B, there is shown a plane view setting forth the unit pixel in the CMOS image sensor in accordance with the first preferred embodiment of the present invention.

In FIG. 4B, the unit pixel includes a first active area 201 where a photodiode 21 will be formed, a second active area 202 where a floating diffusion region 23 and a reset transistor 24 will be formed and a third active area 203 where a drive transistor 25 and a selection transistor 26 will be formed. Herein, the interface area between the first active area 201 and the second active area 202 is reduced as a bottle neck. Herein, the third active area 203 is separated from the first and the second active areas 201 and 202 by predetermined distances, the third active area 203 being disposed aside the first active area 201. In the present invention, it is noted that the second active area 202 for the reset transistor 24 and the third active area 203 for the drive transistor 25 are separated by a FOX area unlike the conventional unit pixel. Thus, it is possible to reduce a detrimental effect to the unit pixel such as a leakage current, e.g., between the VDD contact to the photodiode.

In detail, a gate electrode of the transfer transistor 22 (hereinafter, referred to as a transfer gate, TG) is formed over the interface between the first active area 201 and the second active area 202. A gate electrode of the reset transistor 24 (hereinafter, referred to as a reset gate, RG) is formed over the second active area 202 overlapped a predetermined portion thereof, wherein the VDD is applied to the reset gate (RG). A gate electrode of the drive transistor (hereinafter, referred to as a drive gate, DG) and a gate electrode of the selection transistor (hereinafter, referred to as a select gate, SG) are formed over the third active area 203 which are separated by a predetermined distance. Herein, each gate electrode employs a polysilicon.

Meanwhile, there is an input line 204 which is disposed aside the second active area 202 for applying an input voltage to each reset transistor in a unit pixel array of the CMOS image sensor. That is, the input line 204 is connected to a reset contact (Rx CT) at one end of the second active area 202 for applying a reset control signal (Rx) to the drain of the reset transistor 24, wherein the input line 204 employs a metal line in the present invention. In case of using the metal line as the input line 204 instead of a typical polysilicon line, it has an advantage that a line resistance is reduced in comparison with a polysilicon line.

At one end of the third active area 203 nearby the second active area 202, there is a VDD contact (VDD CT) for applying the VDD to the reset gate (RG). Since the reset gate (RG) is connected to the VDD contact (VDD CT) in the third active area 203, the VDD is applied to the reset gate (RG). Herein, each of the VDD contact (VDD CT) and the reset contact (Rx CT) has a butting contact structure which will be illustrated in detail in FIG. 4D. Though it is not shown in FIG. 4B, the floating diffusion region 23 is connected to the reset gate (RG) and the output contact is formed at the other end of the third active area 203.

Referring to FIG. 4C, there is shown a cross sectional view setting forth the unit pixel in the CMOS image sensor in accordance with the first preferred embodiment of the present invention taken along line A–A' of FIG. 4B.

In FIG. 4C, a p-type epitaxial layer 20A is grown up on a p-type semiconductor substrate 20. There is a p-well 20B in a predetermined location of the p-type epitaxial layer 20A where the drive transistor 25 and the selection transistor 26 will be formed. In preset locations of the p-type epitaxial layer 20A, a first FOX area 27A and a second FOX area 27B are formed, wherein the second FOX area 27B plays a role in isolating the reset transistor 24 and the drive transistor 25 from each other. In the other region of the p-type epitaxial layer 20A where the p-well 20B is not formed, the transfer gate (TG) and the reset gate (RG) are formed separated by a predetermined space from each other. In addition, the drive gate (DG) and the select gate (SG) are formed in the p-well 20B separated by a predetermined gap space from each other. Herein, each gate electrode uses a material such as a polysilicon. On sidewalls of each gate electrode, spacers 27C are formed by a typical method.

In the p-type epitaxial layer 20A between the transfer gate (TG) and the first FOX area 27A, there is a photodiode 21 which has generally a deep n⁻ diffusion region and a shallow p⁰ diffusion region. The floating diffusion region 23 is formed in the p-type epitaxial layer 20A disposed between the transfer gate (TG) and the reset transistor (RG), which is connected to the drive gate through a first metal line 29A. In the p-type epitaxial layer 20A between the reset gate (RG) and the second FOX area 27B, there is a drain region of the reset transistor 24 in order for the reset control signal (Rx) to be applied thereto. Herein, the drive transistor 25 and the selection transistor 26 have the source/drain regions 28B with lightly doped drains (LDDs) 28C in the p-well 20B. Meanwhile, one of the source/drain regions 28B of the selection transistor 26 serves as an output terminal of the unit pixel. In FIG. 4C, the reset gate (RG) is extended to the one of the source/drain regions 28C of the drive transistor 25 for applying the VDD thereto through a second metal line 29B, which will be more described later in FIG. 4D.

Referring to FIG. 4D, there is a cross sectional view setting forth the VDD contact of the butting contact structure which has been described in FIGS. 4A to 4C in accordance with the first preferred embodiment of the present invention.

In FIG. 4D, an interlayer dielectric (ILD) 27D is formed over the drive gate (DG) and the reset gate (RG), wherein an end side of the reset gate (RG) is extended toward the drive gate (DG) and there is an opening between the reset gate (RG) and the drive gate (DG). Thereafter, the ILD 27D is patterned into a preset shape so as to open a portion of the reset gate (RG) and a portion of the drain regions of the drive transistor 25. Afterward, a predetermined metal layer is formed over the resultant structure and is patterned so as to form the second metal line 29B as shown in FIGS. 4C and 4D. Accordingly, the second metal line 29B is connected to the portion of the reset gate (RG) and the portion of the drain region of the drive transistor 25 concurrently. Therefore, the VDD is applied to the reset gate (RG) and the drain of the drive transistor 25. Herein, this contact structure is called the butting contact which is effectively applied to a high aspect contact in particular.

Referring to FIG. 5A, there is shown another circuit diagram setting forth a unit pixel in a CMOS image sensor in accordance with a second preferred embodiment of the present invention.

In FIG. 5A, the unit pixel includes a photodiode 31 and four NMOS transistors 32, 34, 35 and 36. The four transistors include a transfer transistor 32 for transferring photoelectric charges generated from the photodiode 31 to a floating diffusion region 33, a reset transistor 34 for discharging the charges stored in the floating diffusion region 33 to detect subsequent signals, a drive transistor 35 acting as a source follower, and a selection transistor 36 for switching and addressing. In FIG. 5A, a denotation of $C_F$, $C_P$, and Load Tr represent a capacitance of the floating diffusion region, a capacitance of the photodiode 31 and a load transistor, respectively.

In detail, the transfer transistor 32 is disposed between the photodiode 31 and the floating diffusion region 33, wherein a transfer control signal (Tx) is applied to a gate of the transfer transistor 32. In the reset transistor 34, a VDD is applied to a gate of the reset transistor 34 and a reset control signal (Rx) is applied to a drain of the reset transistor 34, wherein a source of the reset transistor 34 is connected to the photodiode 31, which is different from the first embodiment. Furthermore, in the drive transistor 35, the VDD is applied to a drain and a drive control signal (Dx) is applied to a gate which is connected to the floating diffusion region 33. Meanwhile, the selection transistor 36 has source/drain regions of which a drain is connected to the source of the drive transistor 35 and a source of the selection transistor 36 is connected to an output terminal through an output contact, wherein a select control signal (Sx) is applied to a gate of the selection transistor 36.

Referring to FIG. 5B, there is shown a plane view setting forth the unit pixel in the CMOS image sensor in accordance with the second preferred embodiment of the present invention.

In FIG. 5B, the unit pixel includes a first active area and a second active area 304. The first active area has a first region 301, a second region 302 and a third region 303, wherein the photodiode 31, a floating diffusion contact (FD CT) the reset transistor 34 are formed in the first region 301, the second region 302 and the third region 303, respectively. Herein, the second region 302 is formed extended from one corner of the first region 301 and the third region 303 is formed extended from the other corner of the first region 301. In predetermined locations of the second active area 304, there is the drive transistor 35 and the selection transistor 36.

In detail, a transfer gate (TG) is formed over the interface between the first region 301 and the second region 302 and the floating diffusion contact (FD CT) is formed in the second region 302, wherein the floating diffusion contact (FD CT) is connected to one end of the drive gate (DG). Meanwhile, the reset gate (RG) is formed over the interface between the first region 301 and the third region 303, which is connected to the VDD contact 306 in a protrusive portion 304A of the second active area 304. That is, the reset gate (RG) is extended to the second active area 304 so as to be connected to the VDD contact 306. At one end of the third region 303 nearby the second active area 304, there is a reset contact 305 for applying an input voltage to the drain of the reset transistor. Herein, the protrusive portion 304A of the second active area 304 is opposite to the third region 303. The drive gate (DG) and the select gate (SG) are formed over the second active area 304, wherein each gate electrode is separated by a predetermined space from each other. In the other end of the second active area 304, there is an output contact 307 which is connected to the source of the selection transistor 36.

In FIG. 5B, the reset contact 305 of the reset transistor 34 is connected to the third region 303 through a metal line (not shown) and the VDD contact 306 is connected to the reset gate (RG) so that the VDD is applied to the reset gate (RG) and the reset control signal (Rx) is applied to the drain of the reset transistor 34. Herein, the VDD contact 306 is connected to a portion of the reset gate (RG) in a shape of the butting contact structure like the first embodiment.

Referring to FIG. 5C, there is shown a cross sectional view setting forth the unit pixel in the CMOS image sensor in accordance with the second preferred embodiment of the present invention taken along line B–B' of FIG. 5B.

In FIG. 5C, a p-type epitaxial layer 30A is grown up on a p-type semiconductor substrate 30. There is a p-well 30B in a predetermined location of the p-type epitaxial layer 30A where the drive transistor 35 and the selection transistor 36 will be formed. In preset locations of the p-type epitaxial layer 30A, a first FOX area 37A and a second FOX area 37B are formed, wherein the second FOX area 37B plays a role in isolating the reset transistor 34 and the drive transistor 35 from each other. In the other region of the p-type epitaxial layer 30A where the p-well 30B is not formed, the transfer gate (TG) and the reset gate (RG) are formed separated by a predetermined space from each other. In addition, the drive gate (DG) and the select gate (SG) are formed in the p-well 30B separated by a predetermined gap space from each other. Herein, the gate electrode uses a material such as a polysilicon. On sidewalls of each gate electrode, spacers 37C are formed by a typical method.

In the p-type epitaxial layer 30A between the transfer gate (TG) and the reset gate (RG), there is a photodiode 31 which has generally a deep n⁻ diffusion region and a shallow p⁰ diffusion region. The floating diffusion region 33 is formed in the p-type epitaxial layer 30A between the transfer gate (TG) and the first FOX area 34A, which is connected to the drive gate (DG) through a first metal line 39A. A drain region where the reset control signal (Rx) is applied, is formed between the reset transistor 34 and the second FOX area 34B so that the reset transistor 34 is not connected to the floating diffusion region 33 in the second embodiment. Herein, the drive transistor 35 and the selection transistor 36 have the source/drain regions 38B with lightly doped drains (LDDS) 38C in the p-well 30A. Meanwhile, one of the source/drain regions 38A of the selection transistor 36 serves as an output terminal. Here, the reset gate (RG) is extended to the one of the source/drain regions 38B of the drive transistor 35 for applying the VDD thereto through a second metal line 39B.

In the second preferred embodiment as aforementioned, since the VDD is applied to the reset gate (RG) and the input voltage is applied to the drain, there is no threshold voltage for inversion channel so that the output performance and the reset efficiency can be enhanced like the first embodiment. In addition, the input voltage is applied to the drain region of the reset transistor 34 through the metal line instead of the polysilicon, thereby reducing the line resistance in comparison with the polysilicon. Since the second active area 304 and the first active area are separated from each other by a predetermined FOX area therebetween, it is possible to minimize the leakage current generated between the VDD contact 306 and the photodiode 31.

As described in the first and the second embodiments, the present invention provides an advantage that it is possible to minimize the lag phenomenon in virtue of the reduction of the threshold voltage of the reset transistor by applying the VDD to the gate electrode of the reset transistor. Furthermore, since there is employed the butting contact for the VDD contact in manufacturing the unit pixel, it is possible to stabilize the process for requiring a high aspect ratio contact. In addition, the input terminal of the reset transistor uses the metal line, thereby improving a signal delay by means of a decrease of the line resistance. Moreover, the active area for the reset transistor and the transfer transistor and another active area for the drive transistor and the selection transistor are separated from each other so that the leakage current can be minimized which is typically generated between the VDD contact and the photodiode.

While the present invention has been described with respect to the particular embodiments, it will be apparent to those skilled in the art that various changes and modifications may be made without departing from the scope of the invention as defined in the following claims.

What is claimed is:

1. A unit pixel for use in a complementary metal oxide semiconductor (CMOS) image sensor, comprising:
   a semiconductor substrate including an epitaxial layer in which an active area and a field oxide (FOX) area are defined;
   a photodiode formed in a predetermined location of the epitaxial layer;
   a transfer transistor including source/drain regions disposed between the photodiode and a floating diffusion region, wherein a transfer control signal is applied to a gate thereof;
   a reset transistor including source/drain regions disposed between the floating diffusion region and a power supply voltage (VDD) terminal, wherein a reset control signal is applied to a drain thereof;
   a drive transistor of which a gate is connected to the floating diffusion region and a drain is connected to the VDD terminal; and
   a selection transistor of which a drain is connected to a source of the drive transistor and a source is connected to an output terminal, wherein a select control signal is applied to a gate thereof.

2. The unit pixel as recited in claim 1, wherein the reset control signal is applied to the drain of the reset transistor through a metal line and a VDD is applied to a gate of the reset transistor.

3. The unit pixel as recited in claim 1, wherein one active area where the reset transistor is formed and another active area where the drive transistor is formed are separated by the FOX area.

4. The unit pixel as recited in claim 1, wherein each gate electrode of the transistor uses a polysilicon.

5. The unit pixel as recited in claim 1, wherein the gate electrode of the reset transistor is connected to the VDD contact in a shape of a butting contact.

6. A unit pixel for use in the CMOS image sensor comprising:
- a semiconductor substrate including an epitaxial layer in which an active area and a field oxide (FOX) area are defined;
- a photodiode formed in a predetermined location of the epitaxial layer;
- a transfer transistor including source/drain regions disposed between the photodiode and a floating diffusion node, wherein a transfer control signal is applied to a gate thereof;
- a reset transistor including source/drain regions disposed between the photodiode and a power supply voltage (VDD) terminal, wherein a reset control signal is applied to a drain thereof;
- a drive transistor of which a gate electrode is connected to the floating diffusion region and a drain is connected to the VDD terminal; and
- a selection transistor of which a drain is connected to the drain of the drive transistor and a source is connected to an output terminal, wherein a select control signal is applied to a gate thereof.

7. The unit pixel as recited in claim 6, wherein the reset control signal is applied to the drain of the reset transistor through a metal line and a VDD is applied to a gate of the reset transistor.

8. The unit pixel as recited in claim 6, wherein one active area where the reset transistor is formed and another active area the drive transistor is formed are separated by the FOX area.

9. The unit pixel as recited in claim 6, wherein each gate electrode of the transistor uses a polysilicon.

10. The unit pixel as recited in claim 6, wherein the gate electrode is connected to the VDD contact in a shape of a butting contact.

11. A CMOS image sensor having a plurality of unit pixels, said each unit pixel comprising:
- a semiconductor substrate including an epitaxial layer in which an active area and a field oxide (FOX) area are defined;
- a photodiode formed in a predetermined location of the epitaxial layer;
- a transfer transistor including source/drain regions disposed between the photodiode and a floating diffusion region, wherein a transfer control signal is applied to a gate thereof;
- a reset transistor including source/drain regions disposed between the floating diffusion region and a power supply voltage (VDD) terminal, wherein a reset control signal is applied to a drain thereof;
- a drive transistor of which a gate is connected to the floating diffusion region and a drain is connected to the VDD terminal; and
- a selection transistor of which a drain is connected to a source of the drive transistor and a source is connected to an output terminal, wherein a select control signal is applied to a gate thereof.

12. The unit pixel as recited in claim 11, wherein the reset control signal is applied to the drain of the reset transistor through a metal line and a VDD is applied to a gate of the reset transistor.

13. The unit pixel as recited in claim 11, wherein one active area where the reset transistor is formed and another active area where the drive transistor is formed are separated by the FOX area.

14. The unit pixel as recited in claim 11, wherein the gate electrode of the reset transistor is connected to the VDD contact in a shape of a butting contact.

15. A CMOS image sensor having a plurality of unit pixels, said each unit pixel comprising:
- a semiconductor substrate including an epitaxial layer in which an active area and a field oxide (FOX) area are defined;
- a photodiode formed in a predetermined location of the epitaxial layer;
- a transfer transistor including source/drain regions disposed between the photodiode and a floating diffusion node, wherein a transfer control signal is applied to a gate thereof;
- a reset transistor including source/drain regions disposed between the photodiode and a power supply voltage (VDD) terminal, wherein a reset control signal is applied to a drain thereof;
- a drive transistor of which a gate electrode is connected to the floating diffusion region and a drain is connected to the VDD terminal; and
- a selection transistor of which a drain is connected to the drain of the drive transistor and a source is connected to an output terminal, wherein a select control signal is applied to a gate thereof.

16. The unit pixel as recited in claim 15, wherein the reset control signal is applied to the drain of the reset transistor through a metal line and a VDD is applied to a gate of the reset transistor.

17. The unit pixel as recited in claim 15, wherein one active area where the reset transistor is formed and another active area the drive transistor is formed are separated by the FOX area.

18. The unit pixel as recited in claim 15, wherein the gate electrode is connected to the VDD contact in a shape of a butting contact.

* * * * *